(12) United States Patent
Kowalsky et al.

(10) Patent No.: US 12,120,841 B2
(45) Date of Patent: Oct. 15, 2024

(54) PORTABLE COMMAND-AND-CONTROL MODULE

(71) Applicant: Consolidated Networks Corporation, Vacaville, CA (US)

(72) Inventors: John Kowalsky, Vacaville, CA (US); Brian Baesler, Vacaville, CA (US); Erik Howard, Vacaville, CA (US); William Howard, Vacaville, CA (US); Alec Valentino, Vacaville, CA (US); Cesar Villalvazo, Vacaville, CA (US); Todd Wilt, Vacaville, CA (US)

(73) Assignee: Consolidated Networks Corporation, Vacaville, CA (US)

( * ) Notice: Subject to any disclaimer, the term of this patent is extended or adjusted under 35 U.S.C. 154(b) by 0 days.

(21) Appl. No.: 18/354,615

(22) Filed: Jul. 18, 2023

(65) Prior Publication Data
US 2023/0389215 A1  Nov. 30, 2023

(51) Int. Cl.
*H05K 7/14* (2006.01)
*H05K 7/20* (2006.01)
*H10N 10/00* (2023.01)

(52) U.S. Cl.
CPC ......... *H05K 7/1489* (2013.01); *H05K 7/1495* (2013.01); *H05K 7/207* (2013.01); *H10N 10/00* (2023.02)

(58) Field of Classification Search
None
See application file for complete search history.

(56) References Cited

U.S. PATENT DOCUMENTS

| | | | |
|---|---|---|---|
| 4,850,014 A * | 7/1989 | Gillis | H04Q 1/028 D14/240 |
| 5,010,450 A | 4/1991 | Werdin | |

(Continued)

FOREIGN PATENT DOCUMENTS

| | | |
|---|---|---|
| EP | 2749837 A1 | 7/2014 |
| ES | 1202261 U * | 1/2018 |

OTHER PUBLICATIONS

Production Case, "SKB 3RR-14U24-25B", https://productioncase.com/products/skb-3rr-14u24-25b (accessed and archived at web.archive.org Mar. 8, 2023).

(Continued)

*Primary Examiner* — James Wu
*Assistant Examiner* — Christopher L Augustin
(74) *Attorney, Agent, or Firm* — The Law Office of Scot S. Fagerland, PC (57) ABSTRACT

A command-and-control module for communications, ideally in military operating conditions, is adapted for easy insertion into, and removal from, a portable case. A chassis has front and rear vertical plates secured, e.g. welded, to a horizontal plate. At least one DIN rail, for securing electrical and electronic equipment, is mounted to a vertical plate. The case has electrical ports and outlets as well as multiple features to protect the sensitive electronic equipment inside. Shock absorbers between the horizontal plate and the inner surface of the case protect the equipment from mechanical shock. A thermoelectric cooler keeps the equipment from overheating. An inner cover protects the equipment from dust. The inner cover is bolted to the chassis. The chassis is not otherwise affixed to the case. When the bolts are removed, the chassis is easily lifted out by handles.

6 Claims, 9 Drawing Sheets

(56) References Cited

U.S. PATENT DOCUMENTS

| | | | |
|---|---|---|---|
| 6,681,942 B2 | 1/2004 | Haney | |
| 7,758,368 B2 | 7/2010 | Schelonka | |
| 9,176,531 B1* | 11/2015 | Hayden | G06F 1/1632 |
| 10,238,001 B2 | 3/2019 | Agrawal | |
| 10,509,187 B2* | 12/2019 | Carapella | G02B 6/4454 |
| 2004/0025515 A1* | 2/2004 | Evans | G11B 15/6835 |

OTHER PUBLICATIONS

Enclosure Hub, "Altelix 14×12×6 Vented Industrial DIN Rail Fiberglass Enclosure", https://enclosurehub.com/products/altelix-14+12+6-vented-industrial-din-rail-fiberglass-enclosure-fiberglass (accessed and archived at web. archive.org Mar. 8, 2023).

General Dynamics, "Small Form Factor Command & Control (SFF C2) Node", https://gdmissionsystems.com/products/communications/small-form-factor-c2-node (accessed and archived at web.archive.org Mar. 8, 2023).

Next Computing, "Vigor EDS", https://solutions.nextcomputing.com/products/portable-workstations/vigor-eds/ (accessed and archived at web.archive.org Mar. 8, 2023).

U.S. Department of Energy, "Thermoelectric Coolers", published by 2022, accessed Jun. 15, 2023. This page has been archived at web.archive.org.

* cited by examiner

PORTABLE COMMAND-AND-CONTROL MODULE

1. FIELD OF THE INVENTION

This invention is in the field of support racks for electronics, specifically for mounting communications equipment inside a portable case.

2. BACKGROUND OF THE INVENTION

Military operations require an extensive amount of advanced electronics for communications, monitoring, data processing, and more. These electronic components are typically housed in a trailer or bunker called a command-and-control (or "C2") module. The present invention provides a command-and-control module in a portable housing the size of a suitcase. There are numerous obvious advantages to downsizing a command-and-control module to a portable unit. Challenges to this portability include climate control, shock absorbency, secure attachment, connectivity, and ease of interchangeability. The present invention provides improved solutions to these challenges.

3. DESCRIPTION OF RELATED TECHNOLOGY

The current generation of portable command-and-control modules is exemplified by models such as General Dynamics' Small Form Factor C2 Node™. This system is housed in a front-opening case. Inside the case, electronics are bolted to a framework of horizontal and vertical racks, which are in turn bolted to the inside of the case. The interior of the case is cooled with standard convective computer fans.

An alternative embodiment is represented by the Next Computing™ line of "portable workstations". Models such as the Vigor™ provide an open-ended case with a fixed chassis that has multiple expansion slots for electronic racks. Other models simply provide a case with a "foam cutout" in which to position and carry electronic components.

4. SUMMARY OF THE INVENTION

The present invention is a portable command-and-control module characterized by a removable chassis supported inside a top-opening case. The chassis assumes the form of a trough, with two vertical plates permanently affixed to a horizontal plate at the bottom. DIN (Deutsches Institut für Normung/trans. German Institute for Standardization) rails can be secured to the vertical plates. These DIN rails are the point of attachment for electronic components, using standard attachment tabs.

The interior of the case is cooled by a thermoelectric cooler.

The bottom of the case and the horizontal plate of the chassis are equipped with shock-absorbers.

The top of the chassis is secured with hand-turned bolts to an upper horizontal cover. The inner cover, ideally formed of a transparent plastic, protects the electronics from airborne particles when the case is opened. When the hand-turned bolts are removed, the entire chassis lifts quickly and easily out of the case. Horizontal handles connecting the tops of the vertical side plates enable human placement of the chassis in and out of the case. This allows for efficient interchangeability of the electronic components. For instance, depending on the context of the operation, it may be desirable to add a high-end encryptor or to swap a full memory card with a new one.

6. DETAILED DESCRIPTION OF THE PREFERRED EMBODIMENTS

Figure 1:
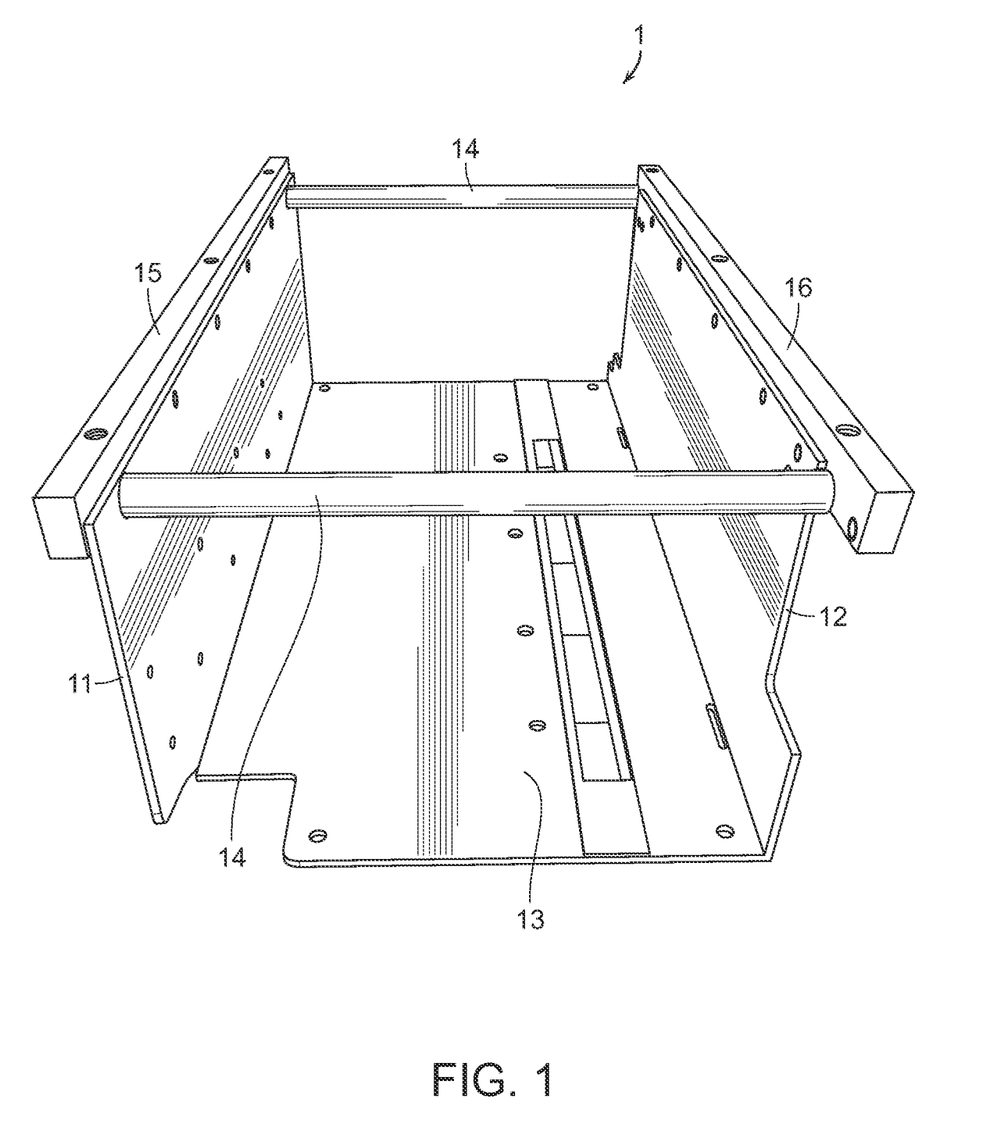
FIG. 1 is a perspective drawing of the chassis viewed from an upper right direction.
Figure 2:
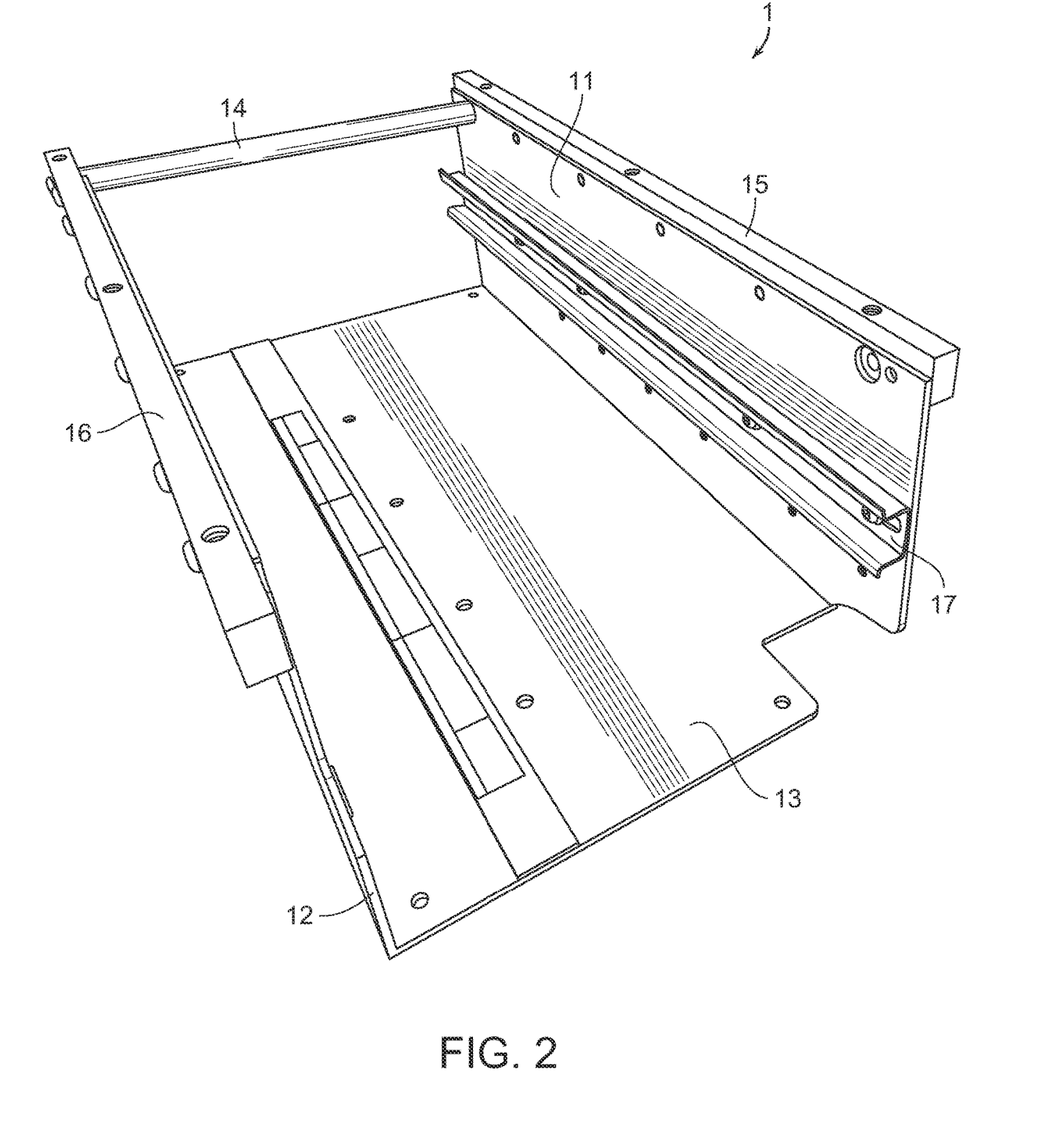
FIG. 2 is a perspective view of the chassis viewed from an upper left rear direction.

FIGS. 1 and 2 are perspective views of a chassis 1 used to support electronic equipment. The chassis has a front vertical plate 11, a rear vertical plate 12, and a horizontal plate 13 connected to the bottoms of the front and rear vertical plates. In a best mode, the plates 11, 12, and 13 are metallic and welded together. Front and rear upper rails, 15 and 16 respectively, are secured to the tops of the front and rear vertical plates, respectively. At least one handle 14 is situated at the top of the chassis, spanning from a front vertical plate or upper rail to a rear vertical plate or upper rail.

In a preferred embodiment, the chassis may support at least one DIN rail. DIN rails are commonly used to support electronic components in factories. FIG. 2 shows a DIN rail 17 secured to the front vertical plate 11.

Figure 3:
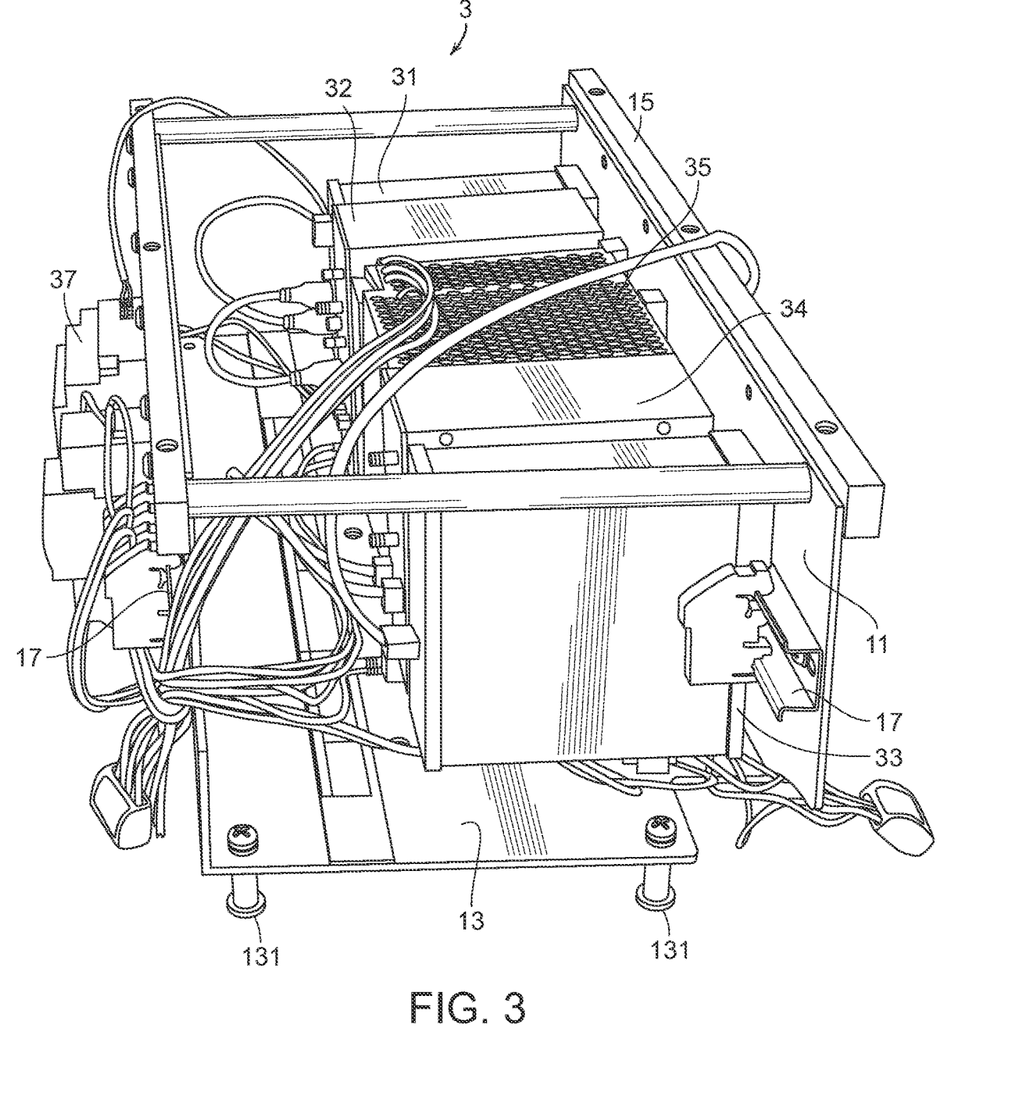
FIG. 3 is a perspective view of the chassis viewed from an upper left direction, with electronic components mounted to the chassis.

In FIG. 3, the chassis 1 supports electrical and electronic equipment 3 mounted on two DIN rails 17, one on the front vertical rail 11 and the other on the rear vertical rail 12. In a preferred embodiment, the electrical and electronic equipment 3 comprises a low side (unencryted) switch 31, a low side router 32, a high side (encrypted) switch 33, a high side router 34, power supplies 35, and ancillary electrical equipment 37, which may include power distribution hardware, a thermostat, and a surge protector. Typical power supplies would include 12, 24, and/or 48 V supplies for the routers and switches and a cooling device.

FIG. 3 also shows chassis-mounted shock absorbers 131 secured to the corners of the horizontal plate 13. The shock absorbers protect the electronic equipment from mechanical impact to the chassis or its case.

Figure 4:
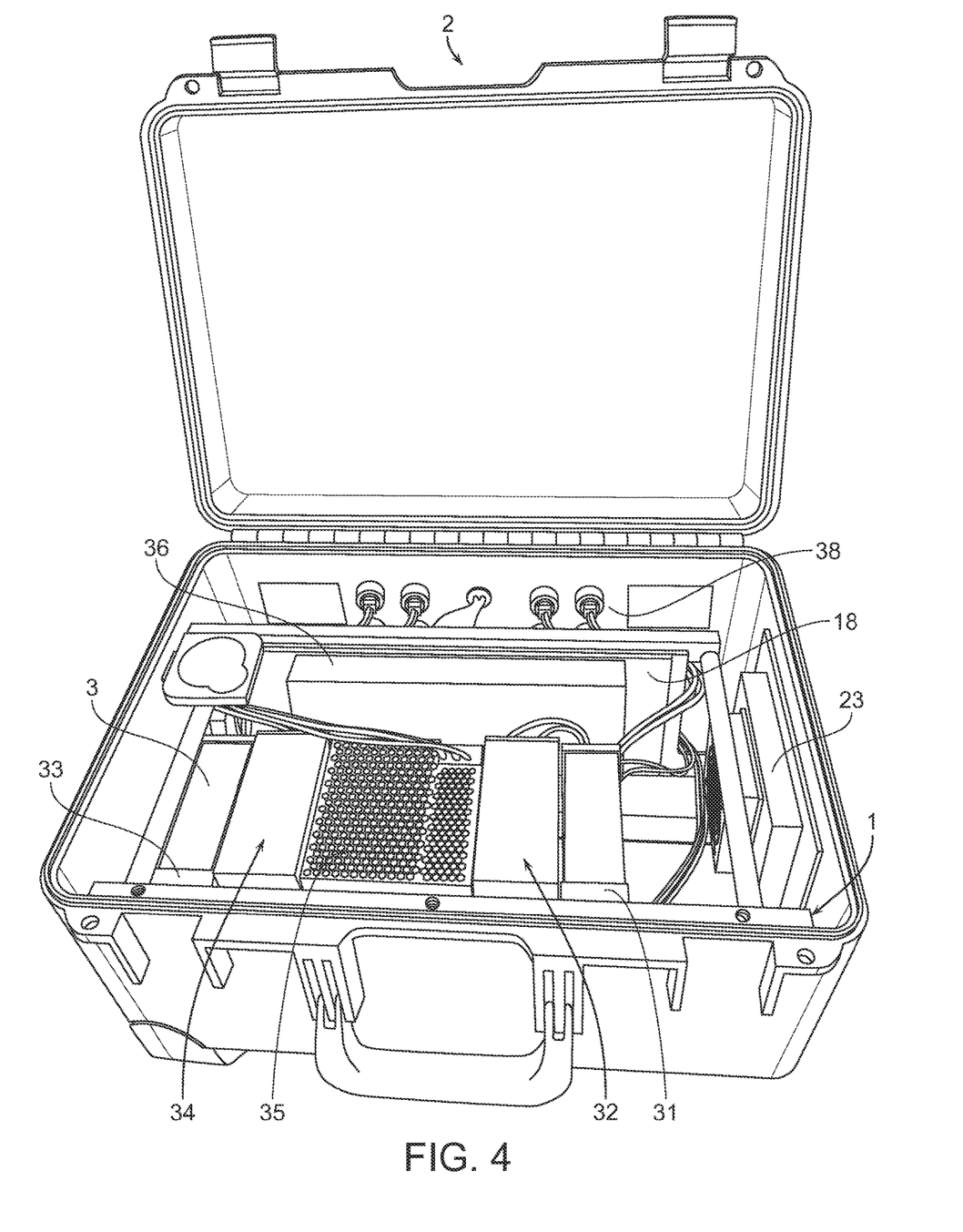
FIG. 4 is a perspective drawing of the chassis and electronic components mounted inside the case, viewed from an upper front direction.

It is helpful to have added capability for an encryptor 36, as seen in FIG. 4. Since it is desirable to have quick and easy access to the encryptor, e.g. to insert or remove it from the chassis, it is practical to mount the encryptor to a removable vertical plate 18, which can be secured to the front or rear vertical plate of the chassis.

In best practice, the chassis is protected within a case 2, shown in FIG. 4. The case provides portability and protection from the environment. In a preferred embodiment, it includes a cooling device, ideally a thermoelectric cooler (TEC) 23. A TEC transfers heat without refrigerant lines, making it lightweight and practical for a small, enclosed space like the case. Nor does it rely on ambient air for convective cooling, which is important when the atmosphere is hot and/or polluted. The case also includes electrical outlets and ports 38 so that the electrical and electronic equipment 3 may be plugged into peripheral devices and power supplies.

Figure 5:
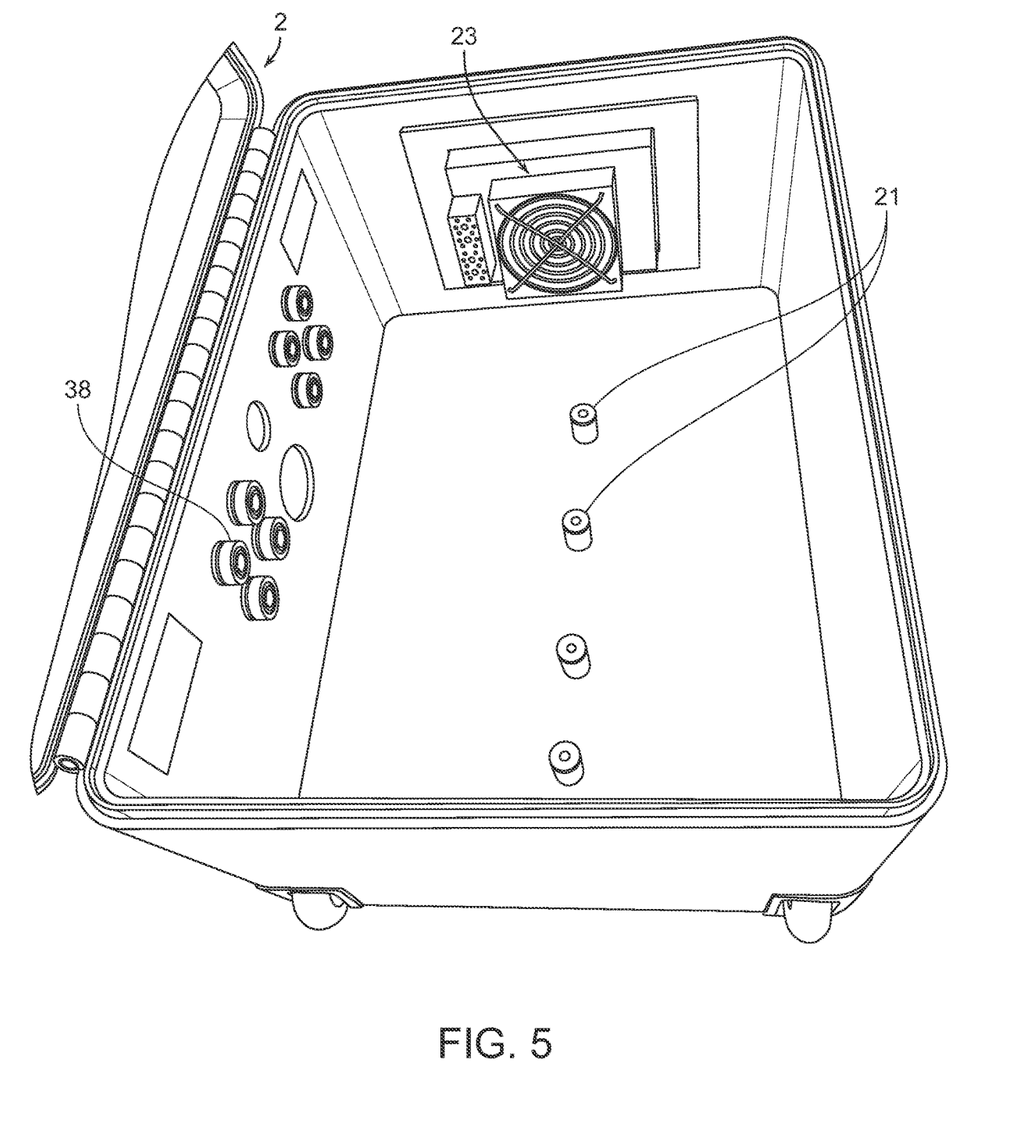
FIG. 5 is a perspective view of the inside of the case, viewed from an upper left direction.

FIG. 5 shows the interior of the case 2, with a clear view of the TEC 23 and the electrical outlets and ports 38. The interior of the case may have case-mounted shock absorbers 21 as further protection against mechanical shock.

Figure 6:
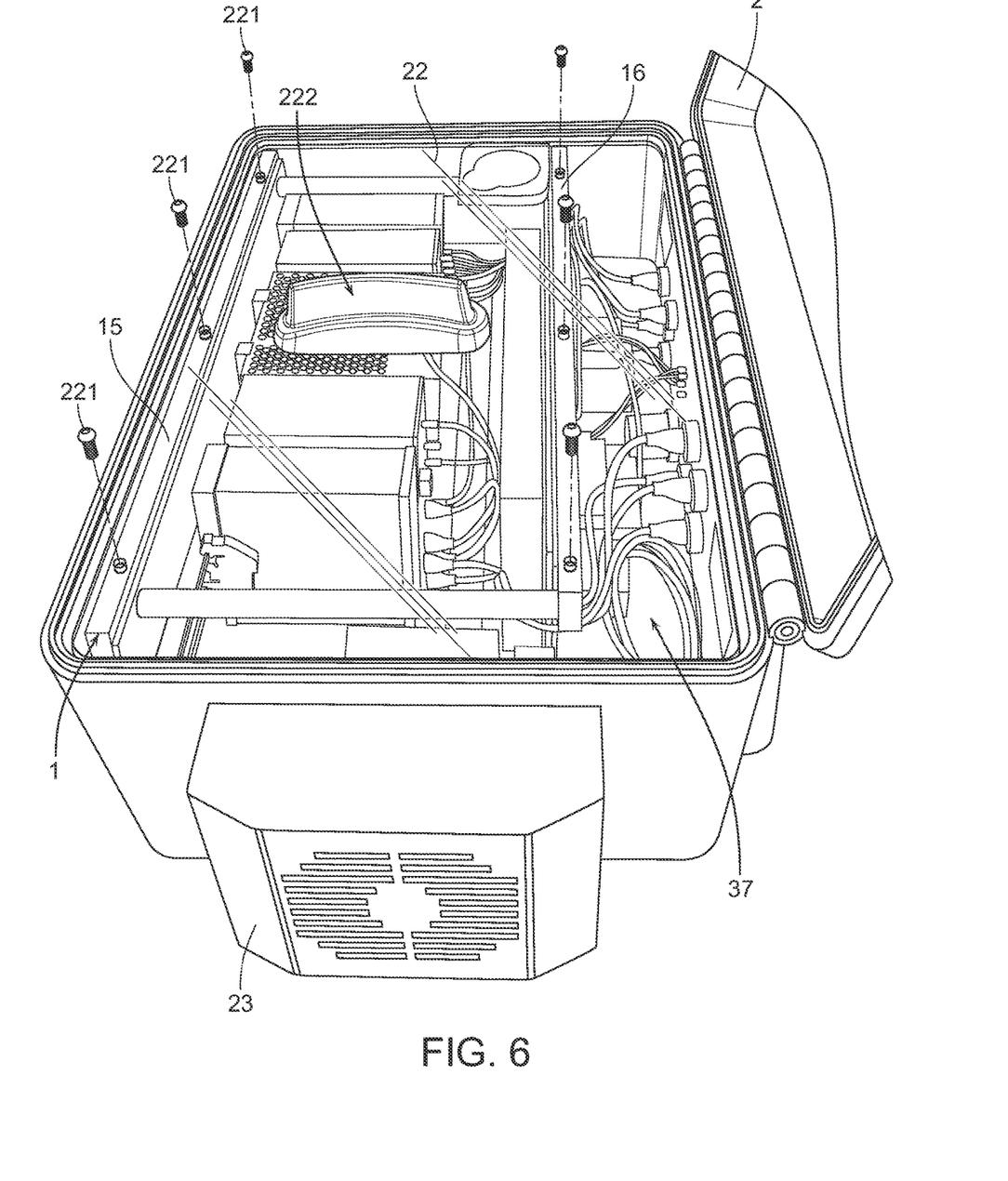
FIG. 6 is an upper-right perspective view of the open case with the chassis inside, protected by the inner cover.

FIG. 6 presents an alternative view of the case 2 containing the chassis 1, which supports electrical and electronic equipment. An inner cover 22 (which may be fabricated of a transparent plastic) protects the underlying equipment from atmospheric particles. The inner cover 22 is secured to the front and rear upper rails 15 and 16, for example with inner cover bolts 221. The inner cover also makes a suitable mount for an antenna 222, which is used to convey signals between the routers and outside communication devices such as satellites, cell phone towers, or other command-and-control modules.

Figure 7:
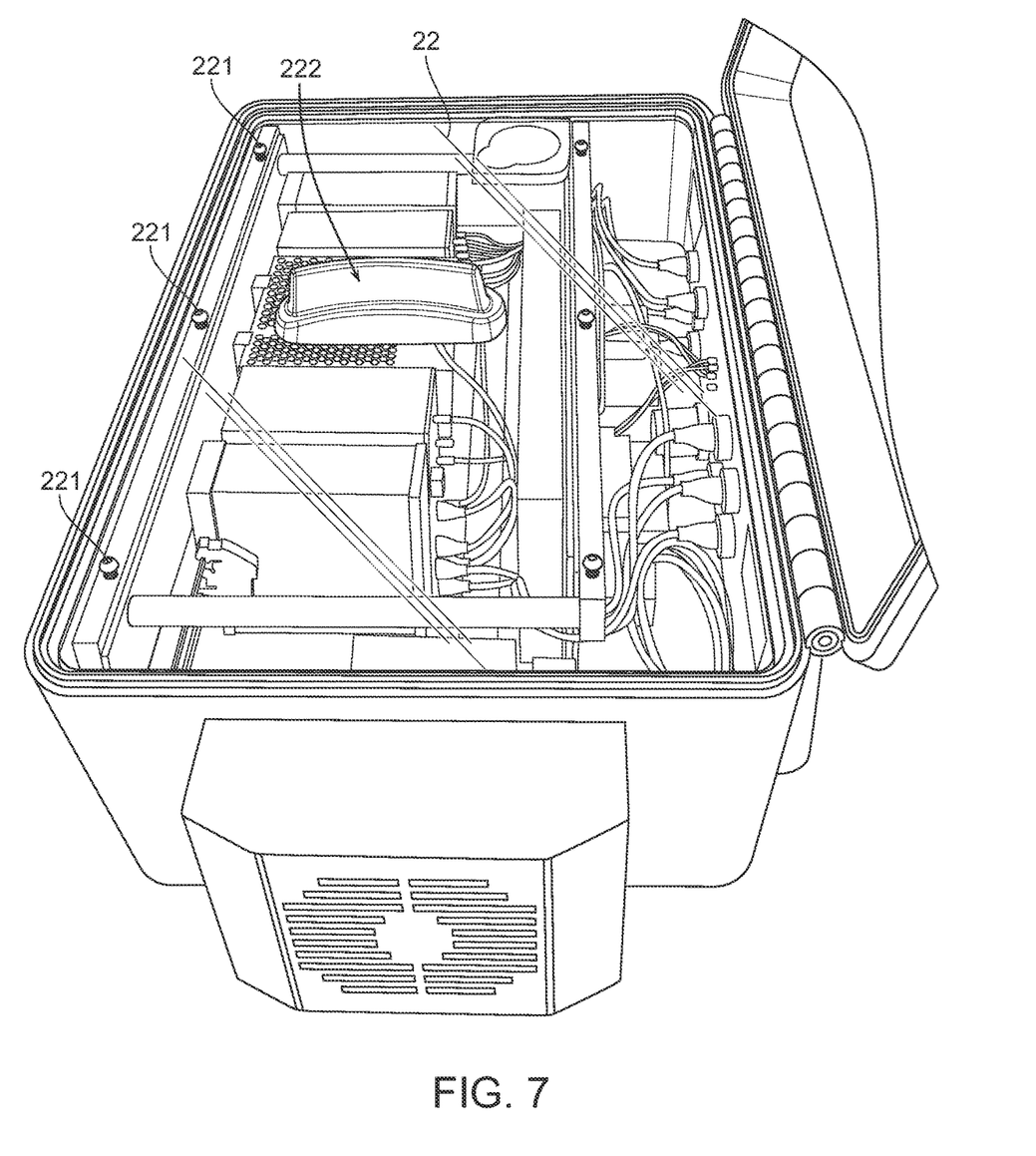
FIG. 7 illustrates removal of the bolts to lift the inner cover and access the chassis inside the case.

FIG. 7 illustrates the process of inserting the chassis 1 into the case 2, or similarly removing the chassis from the case. After removal of the inner cover bolts 221, the inner cover 22 can be lifted to access the chassis and electronics below. The antenna 222 functions as a handle or grip for the inner cover.

Figure 8:
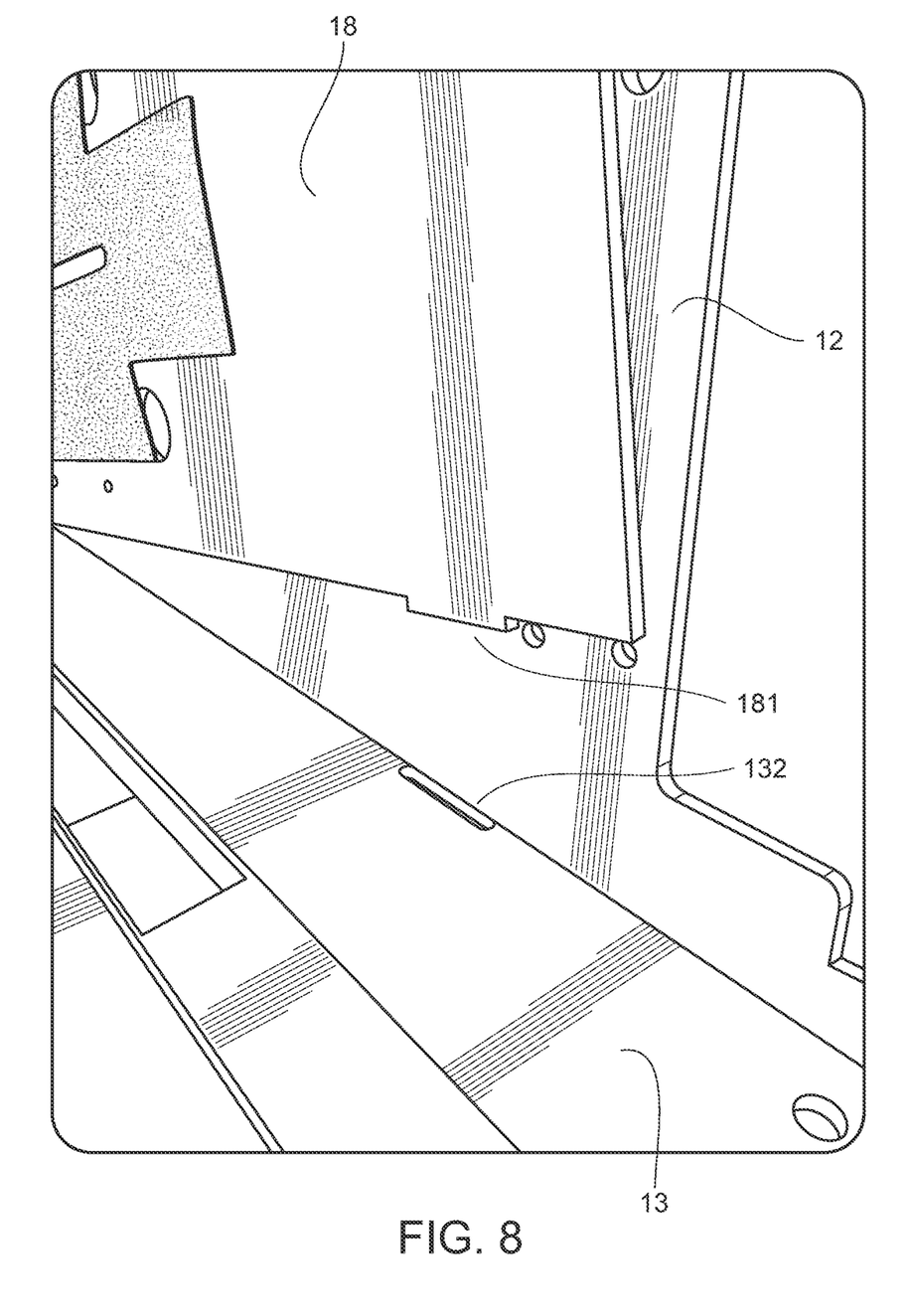
FIG. 8 shows an optional third removal middle vertical plate being positioned alongside the rear vertical plate.

FIG. 8 presents a closer look at the removable vertical plate 18. As shown, it is being positioned adjacent to the rear vertical plate 12. Tabs 181 at the bottom of the removable vertical plate may be placed into slots 132 along the edge of the horizontal plate 13. The removable vertical plate may then be secured to the rear vertical plate 12, e.g. with bolts.

Figure 9:
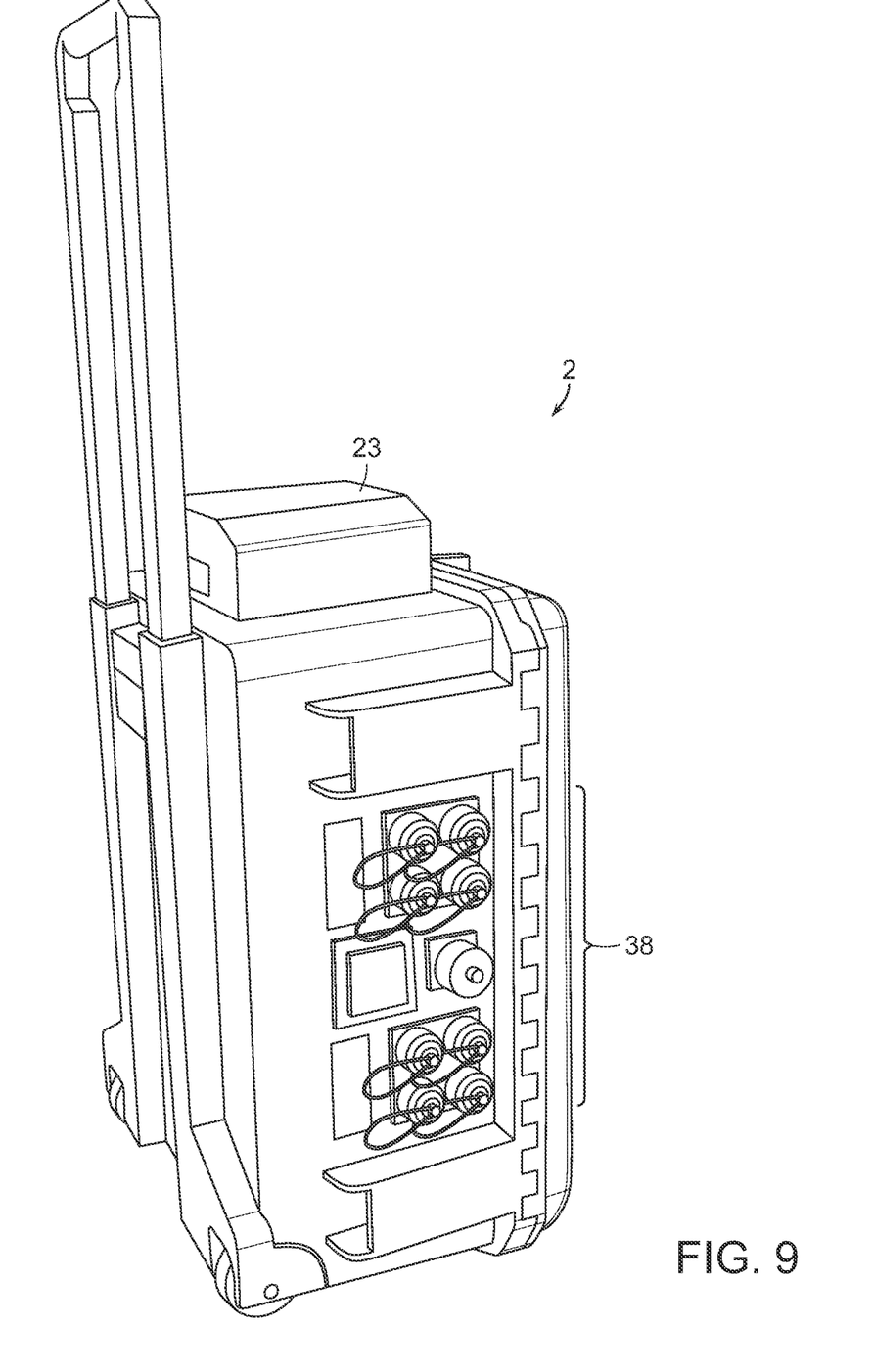
FIG. 9 is a perspective view of the closed case.

The case 2 is seen closed in FIG. 9. It is equipped with a handle and wheels for easy transport. The electrical outlets and ports 38 ideally include a fiber optic cable assembly link and an outlet to a multiple-input/multiple-output antenna.

We claim a portable command-and-control module, comprising:

1. A case comprising electrical outlets and ports;
A chassis mounted inside the case, comprising
    a front vertical plate with a top end and a bottom end;
    a rear vertical plate with a top end and a bottom end;
    a horizontal plate connected to the bottom end of the front vertical plate and to the bottom end of the rear vertical plate;
    at least one handle connected to the top end of the front vertical plate and to the top end of the rear vertical plate;
at least one DIN rail mounted to the chassis;
a front upper rail attached to the top end of the front vertical plate;
a rear upper rail attached to the top end of the rear vertical plate;
an inner cover inside the case and in contact with the front upper rail and the rear upper rail;
inner cover bolts to secure the inner cover to the front upper rail and to the rear upper rail;
a thermoelectric cooler;
a thermostat to monitor the temperature of the case and to regulate the operation of the thermoelectric cooler;
chassis-mounted shock absorbers mounted to the horizontal plate so as to contact the case when the chassis is mounted in the case;
and case-mounted shock absorbers mounted to the case so as to contact the chassis when the chassis is mounted in the case.

2. The invention of claim 1, further comprising
a removable vertical plate;
plate securing means to secure the removable vertical plate to the rear vertical plate.

3. The invention of claim 2, further comprising electrical and electronic equipment mounted to at least one DIN rail.

4. The invention of claim 3,
wherein the electrical and electronic equipment comprises at least one router and at least one switch;
further comprising an antenna inside the case, to transmit signals to and from the at least one router.

5. The invention of claim 4, further comprising
at least one encryptor mounted to the removable vertical plate;
at least one encrypted switch;
and at least one encrypted router.

6. The invention of claim 5, wherein the electrical outlets and ports in the case comprise
a fiber optic cable assembly link;
and an outlet to a multiple-input/multiple-output antenna.

* * * * *